United States Patent [19]

Saito

[11] Patent Number: 4,772,951
[45] Date of Patent: Sep. 20, 1988

[54] SOLID STATE IMAGE SENSOR WITH CELL ARRAY OF AMORPHOUS SEMICONDUCTOR PHOTOELECTRIC CONVERTING ELEMENTS

[75] Inventor: Tamio Saito, Tokyo, Japan

[73] Assignee: Kabushiki Kaisha Toshiba, Kawasaki, Japan

[21] Appl. No.: 31,844

[22] Filed: Mar. 30, 1987

[30] Foreign Application Priority Data

Mar. 31, 1986 [JP] Japan .................................. 61-72952

[51] Int. Cl.$^4$ ............................................. H04N 3/14
[52] U.S. Cl. .............................................. 358/213.11
[58] Field of Search ................. 250/522.1; 358/213.11, 358/213.13

[56] References Cited

U.S. PATENT DOCUMENTS 4,589,026 5/1986 Ozawa et al. .................. 358/213.11
4,660,089 4/1987 Lee .................................. 358/213.11

OTHER PUBLICATIONS

"Test Fabrication of Large Size Image Sensor For Facsimile", Kazumi Komiya et al., SSD77-56, 1977.

Primary Examiner—L. T. Hix
Assistant Examiner—David Porterfield
Attorney, Agent, or Firm—Oblon, Fisher, Spivak, McClelland & Maier

[57] ABSTRACT

A contact-type linear image sensor has two separate substrates aligned adjacent to each other. A linear array of amorphous silicon photoelectric converting elements serving as photoelectric cells and a matrix wiring unit are provided on a first substrate. Driver IC chips are mounted on a second substrate. Connection pad patterns for common cell electrodes of cell groups and connection pad patterns for row signal lines of the matrix wiring unit are provided concentrically at a peripheral edge of the first substrate to be aligned along a junction edge line defined between the substrates. Connection pad patterns for the IC chips are linearly aligned at a peripheral edge of the second substrate and along the substrate junction edge line to oppose the pad patterns of the first substrate. A connector unit for electrically connecting the pad patterns of the first and second substrates may be provided at only one position of the junction edge portion of the first and second substrates.

12 Claims, 3 Drawing Sheets

SOLID STATE IMAGE SENSOR WITH CELL ARRAY OF AMORPHOUS SEMICONDUCTOR PHOTOELECTRIC CONVERTING ELEMENTS

BACKGROUND OF THE INVENTION

The present invention relates to a solid state image sensor and, more particularly, to a contact-type image sensor having a linear cell array of amorphous semiconductor photoelectric converting elements, which are switch-driven using a matrix drive technique.

Amorphous semiconductor image sensors are preferably used for various types of optical image reading equipment such as a facsimile system, an optical code reader, a copying machine, etc., since the use of such image sensors makes it possible to miniaturize the equipment. In particular, considerable effort has been given to the development of contact-type solid state linear image sensors having substantially the same length as the width of paper documents to be read. Such image sensors offer an advantage over other kinds of imaging devices in that they can eliminate image reduction that uses a lens system before the document image reaches thereto, so that the optical image reading equipment can be made compact in size.

The contact-type amorphous semiconductor image sensor is usually connected to a matrix circuit and switch-driven by a matrix drive technique. In this case, linearly aligned photoelectric converting elements serving as pixels (picture elements) are divided into pixel groups or cell units, which are connected at their first comb-shaped planar electrodes serving as individual cell electrodes to an image signal detector, through a matrix wiring circuit consisting of crossed row and column signal lines. In each pixel group a second comb-shaped planar electrode is provided to serve as a common electrode therefor. The second comb-shaped planar electrodes of pixels are connected to a drive voltage generator. The photoelectric converting elements are successively selected with each pixel group as a unit, so that time sequential video signals may be obtained by the image signal detector.

According to the conventional image sensor, an amorphous silicon layer is provided on a substrate to serve as a photoelectric converting layer for photoelectric converting elements. Image light incident on the photoelectric converting elements is sensed utilizing a photoconductive effect of the amorphous silicon layer. The amorphous silicon layer is formed to cover the predetermined surface region on the substrate using a thin film fabrication technique such as a chemical vapor deposition or CVD method and an etching technique, which are similar to a method of manufacturing a semiconductor IC. More specifically, an amorphous silicon layer is deposited on the entire top surface of a single substrate. Subsequently, most of the amorphous silicon layer thus deposited is removed, except part of a desired region, by an etching technique. As a result, the amorphous silicon layer may be formed only in the surface region of the substrate occupied by the photoelectric converting elements. Electrical circuits such as a matrix wiring/drive circuit and a signal readout circuit are formed on the substrate surface from which the amorphous silicon layer is removed.

However, a conventional image sensor in which the photoelectric converting elements are formed together with peripheral electrical circuits on the single substrate has a problem of low productivity. This problem is caused since the amorphous silicon layer must be deposited once on the entire surface of the substrate. Since an area of the amorphous silicon layer which can be deposited at one time is limited in a CVD system, the number of substrates of a single-substrate-type image sensor which can be CVD-grown at the same time in the CVD system is reduced, resulting in poor packaging efficiency of the substrates in the CVD system. As a result, productivity of the image sensor is degraded to undesirably increase the manufacturing cost.

In order to cope with the problem, it is proposed that an image sensor substrate is divided into a first substrate for forming a sensor unit (photoelectric converting element unit) and a second substrate for forming a peripheral electrical circuit arrangement including a matrix wiring and a signal readout circuit and the like. In this case, since area of the separated first substrate for forming the sensor unit housed in the CVD system for growing the amorphous silicon layer is reduced (miniaturized) by approximately 50%, packaging efficiency of the substrates in the CVD system and productivity relating to formation of the amorphous silicon layer are improved. The first substrate is thereafter subjected to an etching process, in which the amorphous silicon layer is fabricated to obtain a desired planar shape, thereby obtaining the photoelectric converting elements serving as the sensor unit.

The method of dividing the substrate into two separated substrates improves productivity of the image sensor, but it poses another problem in that an arrangement for electrically connecting the separated substrates is complex. Normally, in order to electrically connect the substrates, thin wide flexible connectors are used. However, these flexible connectors occupy a large space in the image sensor, thereby degrading packaging efficiency. As a result, compactness, an essential merit of the image sensor, is degraded, and its operational reliability is also degraded.

SUMMARY OF THE INVENTION

Accordingly, it is an object of the present invention to provide a novel and improved solid state image sensor, irrespective of having two separated substrates for a sensor unit and a peripheral circuit arrangement, which is superior in productivity, and in which an electrical connection arrangement between the two substrates is simplified, thereby improving operational reliability.

In accordance with the above object, the present invention is addressed to a specific solid state image sensor which has two separate substrates aligned adjacent to each other along a junction edge line. Photoelectric converting elements serving as photoelectric cells of the image sensor and a matrix wiring unit are provided on a first substrate, while electrical circuit units for driving the photoelectric converting elements to generate a time sequential image signal are separately mounted on a second substrate.

The photoelectric converting elements are aligned linearly on the first substrate and divided into cell groups. The photoelectric converting elements included in each cell group have first terminals serving as individual cell electrodes and second terminals connected to the common cell electrode. The matrix wiring unit has column signal lines connected to the photoelectric converting elements and row signal lines crossing the column signal lines to form a matrix wiring pattern.

Connection patterns of the first substrate are aligned linearly along a junction edge line defined between the first and second substrates. The connection patterns include first connection patterns connected to the common cell electrode of each cell group and second connection patterns connected to row signal lines. The connection patterns of the second substrate, i.e., the third connection patterns, are connected to the electrical circuit units and aligned linearly along the junction edge line between the first and second substrates at the periphery of the second substrate so as to oppose the first and second connection patterns in a one-to-one corresponding manner. A connector unit is provided to electrically connect the first and second connection patterns with the third connection patterns, thereby connecting the photoelectric converting elements aligned on the first substrate with the electrical circuit units separately aligned on the second substrate through the matrix wiring unit.

The present invention together with its objects and advantages will become more apparent in a detailed description of preferred embodiments to be presented below.

BRIEF DESCRIPTION OF THE DRAWINGS

In the detailed description of preferred embodiments of the invention presented below, reference is made to the accompanying drawings in which.

DETAILED DESCRIPTION OF THE PREFERRED EMBODIMENTS

Figure 1:
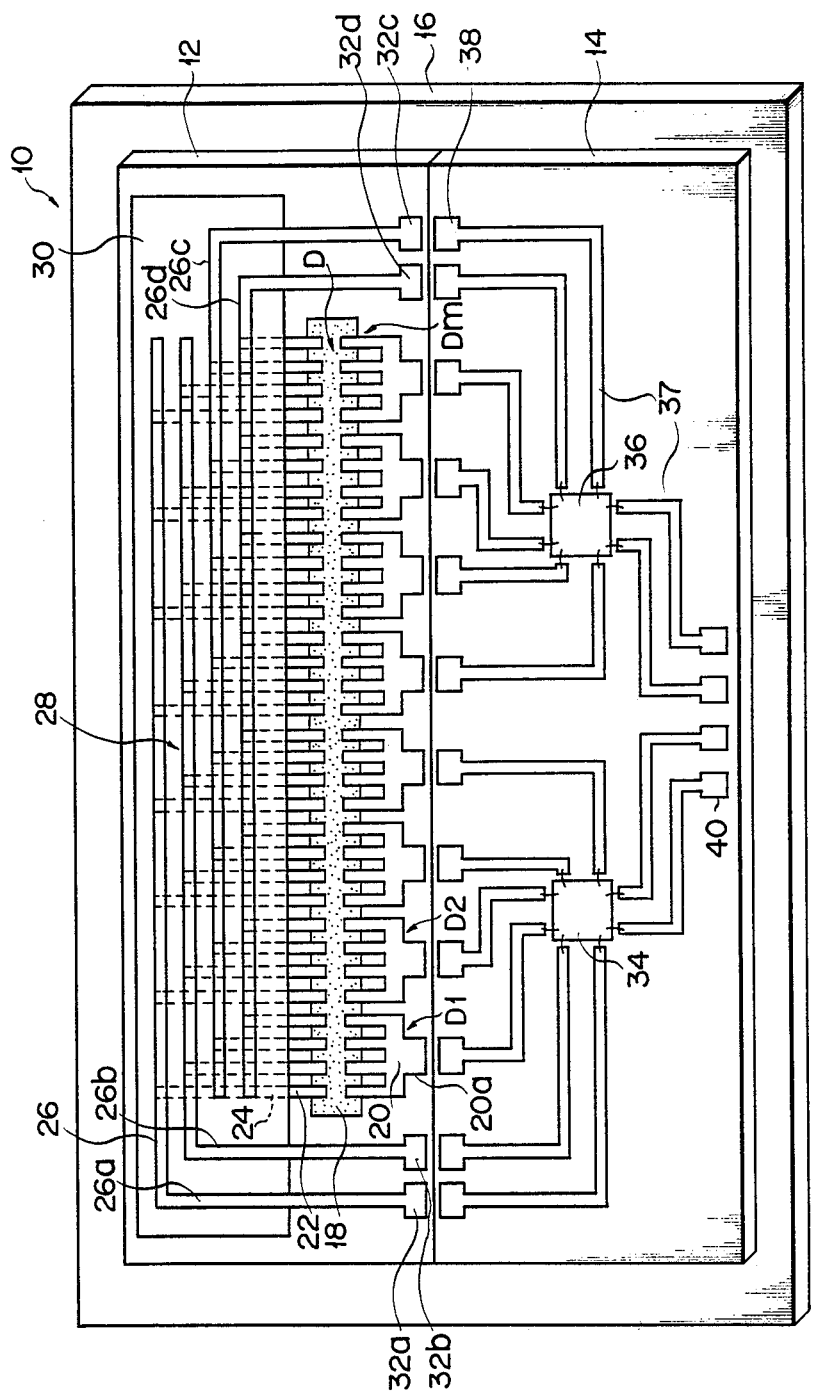
FIG. 1 shows a schematical plan view of a contact-type linear image sensor having two separate substrates in accordance with a first embodiment of the present invention, wherein a photoconductive cell array and a peripheral circuit arrangement associated therewith are respectively formed on the substrate.

There is shown in FIG. 1 of the drawings a contact-type solid state linear image sensor 10 with a pixel array of photoelectric converting elements, in accordance with one preferred embodiment of the present invention. The image sensor 10 has two separate insulative substrates 12 and 14, which are thin rectangular plate-shaped and mounted on a mother plate 16. These substrates 12 and 14 are fixedly placed on plate 16 in such a manner that they are in direct contact with each other at their longitudinal edge lines. The first substrate 12 serves as a sensor board on which a sensor unit is provided which is comprised of a pixel array of photoelectric converting elements, which are linearly aligned along the longitudinal direction of the first substrate 12 to serve as photoconductive cells (picture elements). The second substrate 14 functions as an electrical circuit board on which a peripheral circuit arrangement is formed, which includes a matrix circuit and image signal readout circuit.

A stripe-shaped amorphous semiconductor (silicon) layer 18 is formed on first substrate 12 to serve as an electric converting layer for the image sensor. Photoconductive cells D are formed on amorphous silicon layer 18 such that they are divided into M cell groups (or cell units) D1, D2, ... Dm, each consisting of N cells. In this embodiment, the number M is set to 54 and N is 32 (total cell number is 1,728) in order to obtain the image resolution of 8 pixels/mm for an A4-size paper document. It should be noted, in FIG. 1, that only $4 \times 8$ cells are illustrated for the aim of simplification of drawing.

Comb-shaped planar metallic layers 20 are formed on substrate 12 to connect in common the first electrodes of photoconductive cells D included in each cell unit Di ($i = 1, 2, \ldots, M$). Layers 20 may thus serve as common cell electrodes for cell units D1, D2, ..., Dm. (The suffixes 1, 2, ... will be used for other elements as well. Where it is not necessary to distinguish, the suffixes may be dropped in the following description.) $M \times N$ linear metallic cell electrode layers 22 are also formed on substrate 12 in such a manner as to be connected to the second electrodes of photoconductive cells D, thereby functioning as individual cell electrodes. Individual cell electrodes 22 are respectively connected to column signal lines 24, which are formed to run vertically on substrate 12. Column signal lines 24 are electrically crossed on substrate 12 with horizontally-running row signal lines 26 to define a matrix circuit 28. In this matrix circuit 28, a thin insulative film layer 30 is provided between column and row signal line patterns 24 and 26 and has contact holes (not shown), through which the column lines of each cell unit Di are electrically connected with the corresponding row signal lines in a known manner. Layers 20, 22, 24, 26 and 30 may be deposited on substrate 12 by a known thin film fabrication processes.

Common cell electrodes 20 have connection pad patterns 20a aligned along the longitudinal edge line of substrate 12. Row signal lines 26 are divided into a first line group of the upper half (in FIG. 1, since only four cells are drawn for each cell group as described above, only four row lines are shown, so that there are two row lines in the upper half) and a second line group of the lower half (similarly, two row lines in FIG. 1). Row lines 26a and 26b, which belong to the first line group, bend 90° at their left ends and are respectively connected to connection pad patterns 32a and 32b. Row lines 26c and 26d, which belong to the second line group, bend 90° at their right ends and are respectively connected to connection pad patterns 32c and 32d. Connection pad patterns 32 are aligned linearly with pad patterns 20a of common cell electrodes 20 described above along the longitudinal edge line of substrate 12. Row lines 26 do not overlap amorphous silicon layer 18 because lines 26 extend outside layer 18.

Integrated pixel signal readout circuits 34 and 36 are mounted on second substrate 14. IC chips 34 and 36 include a drive circuit for sequentially supplying a drive voltage to either patterns 20 or lines 26 provided on substrate 12, and a detection circuit for sequentially detecting a light current (pixel current) flowing through the remaining one of patterns 20 or lines 26 upon application of the drive voltage and generating a pixel signal. Since the internal arrangements of these circuits are well known to those skilled in the art, a detailed description thereof will be omitted. The left half of photoconductive cells D is driven by IC chip 34 while the right half thereof is driven by IC chip 36.

Using a wire bonding technique, IC chips 34 and 36 are electrically connected to the corresponding signal line patterns 37 formed on substrate 14. More specifically, substrate 14 has connection pad patterns 38, aligned linearly along the longitudinal direction adjacent to substrate 12. IC chip 34 is connected, through the left half of patterns 38, to common cell electrodes of cell units in the left half of photoconductive cells D and to row lines (26a and 26b) which belong to the first line group. IC chip 36 is connected, through remaining patterns 38, to common cell electrodes of cell units in the right half of photoconductive cells D and to row lines (26c and 26d) which belong to the first line group. Substrate 16 has connection pad patterns 40 required for connecting the image sensor to an external unit (not shown) to be associated therewith. Patterns 40 are aligned linearly along the longitudinal direction at the opposite side of substrate 14. Patterns 40 are connected to the corresponding terminals of IC chips 34 and 36, as shown in FIG. 1. Accordingly, the signal patterns are substantially axially symmetrical at the right and left sides on substrate 14.

Figure 2:
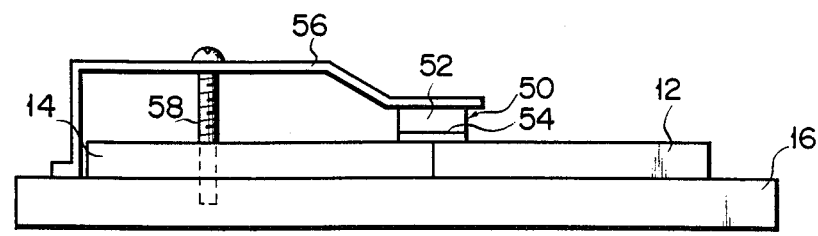
FIG. 2 is an enlarged side view of the contact-type linear image sensor of FIG. 1.

FIG. 2 is a side view of sensor 10 showing more clearly an electrical connection between first and second substrates 12 and 14. A thin rubber connector 50 is provided to electrically connect common cell electrode patterns 20 and connection pad patterns 32 of row lines 26 provided on substrate 12 to pad patterns 38 of substrate 14. Rubber connector 50 is appropriately arranged along the adjacent longitudinal directions (junction edge lines) of substrates 12 and 14 so as to overlap the adjacent corresponding two pad patterns.

Figure 3:
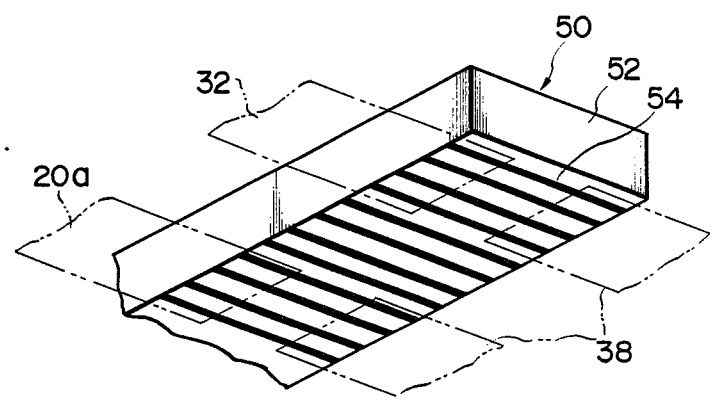
FIG. 3 partially shows a perspective view of a connection rubber pad which is used to make an electrical connection between the corresponding line patterns of the substrates of the image sensor shown in FIG. 1.

Rubber connector 50 is constituted by soft and elastic insulator 52 of, e.g., silicon rubber and conductive layer 54 formed to define a stripe-shape on the lower surface of insulator 52. The stripe-shape of layer 54 is formed along its widthwise direction so that "zebra patterns" extend along the row direction of substrate 12, as shown in FIG. 3, when connector 50 is placed on two separate substrates 12 and 14. Accordingly, even if the placement of rubber connector 50 is slightly deviated from substrates 12 and 14, electrical leakage of a signal between adjacent pad patterns on the single substrate (e.g., 32a and 32b) can be prevented to effectively and electrically connect substrates 12 and 14. Connector 50 is tightly fixed on substrates 12 and 14 by fixing plate 56 and screw 58.

According to the image sensor having the above arrangement, patterns 20a for electrodes 20 and patterns 32a, 32b, 32c, and 32d for lines 26 of substrate 12, on which the sensor unit is mounted, are all aligned linearly along the junction boundary edge line between substrate 12 and adjacent substrate 14, on which the peripheral circuit arrangement of the sensor unit is mounted. Patterns 38 of substrate 14 are aligned linearly along the above substrate junction boundary line so as to correspond to patterns 20a, 32a, 32b, 32c, and 32d in a one-to-one correspondence manner. Accordingly, simply by providing a connector (e.g., pad 50) on the only edge line on which substrates 12 and 14 are adjacent to each other, an electrical connection between substrates 12 and 14 can be easily realized. Therefore, not only the packaging space of the electrical connection arrangement between two separate substrates 12 and 14 of the image sensor can be minimized, but also, the reliability of the electrical connection arrangement can be improved. For this reason, although the image sensor substrate is divided into two separate substrates 12 and 14 to improve productivity, the image sensor can be made compact in size as a whole.

Secondly, according to this image sensor, the upper and lower halves of lines 26 on substrate 12 on which the sensor unit is mounted are independently wired so as to be connected to substrate 14, thereby dividing the connection pad patterns of lines 26 into two groups, located at both sides of an array of the connection pad patterns of electrodes 20. Accordingly, the total length of lines 26 can be minimized to reduce stray capacitance. As a result, variations in response time during readout of a pixel signal can be suppressed to improve operational reliability of the image sensor.

Thirdly, since short band-like layer 18 is formed on substrate 12 so as not to overlap lines 26, signal current leakage and crosstalk during readout of a time sequential pixel signal can be suppressed, thereby improving the signal-to-noise ratio of the pixel signal.

Figure 4:
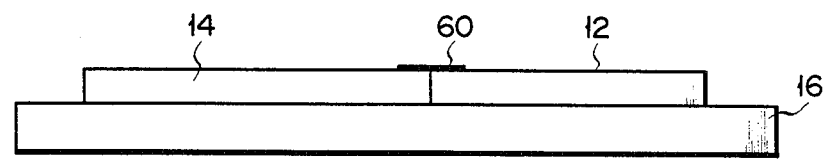
FIG. 4 is an enlarged cross-sectional view of a contact-type linear image sensor in accordance with a second embodiment of the present invention.

According to a contact-type image sensor as a second embodiment of the present invention shown in FIG. 4, an electrical connection between first and second substrates 12 and 14 is performed by thermally pressing laminated connection conductive film 60 against the boundary between substrates 12 and 14. As a result, the electrical connection arrangement between substrates 12 and 14 of the image sensor can be greatly simplified, so that the image sensor can be made more compact in size.

Figure 5:
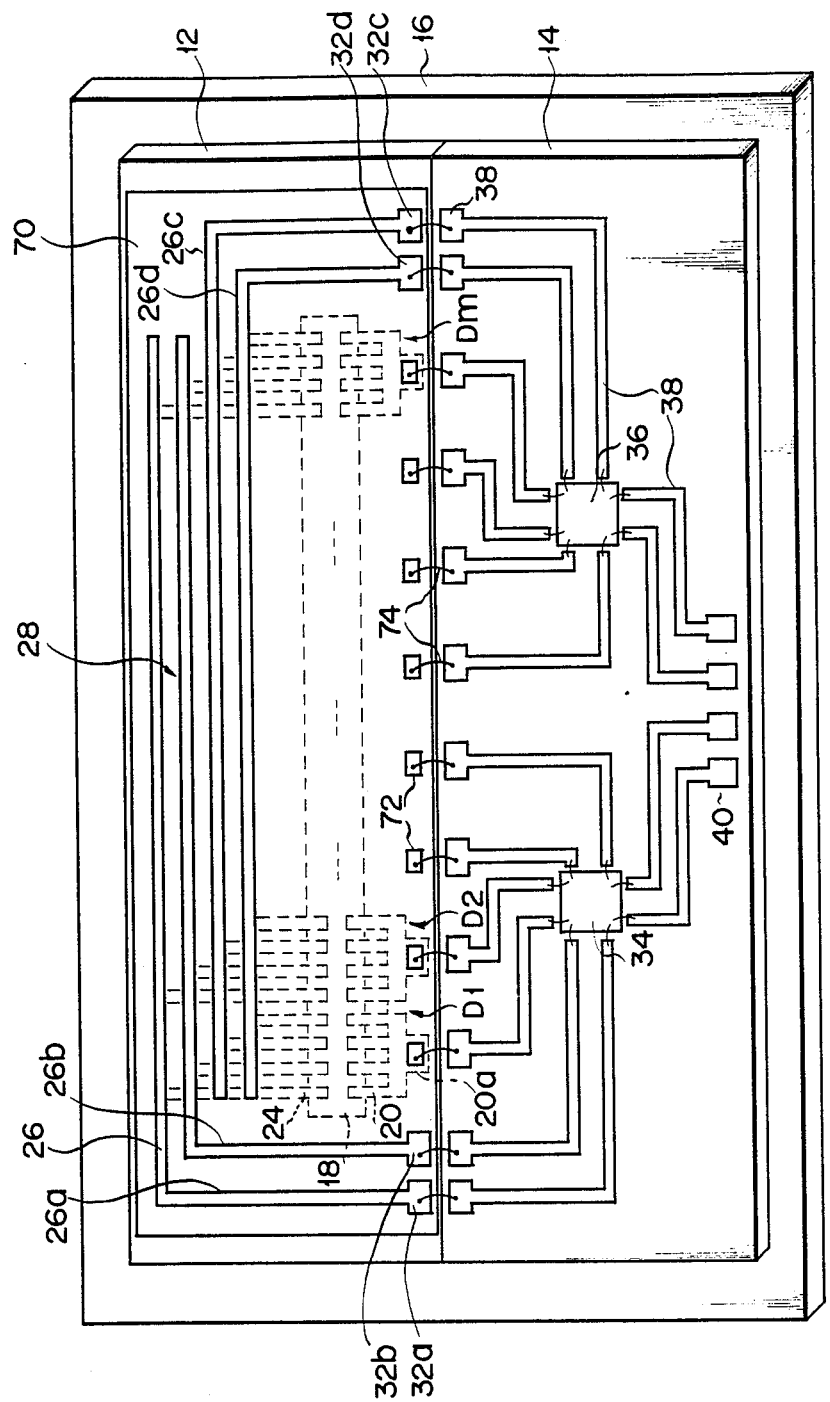
FIG. 5 shows a schematical plan view of a contact-type linear image sensor in accordance with a third embodiment of the present invention.

FIG. 5 is a plan view of a contact-type image sensor as a third embodiment of the present invention. It will be noted, in FIG. 5, that the same parts as shown in FIG. 1 are denoted by the same reference numerals, and a detailed description thereof will be omitted. The third embodiment differs from the first embodiment in that the insulative layer is extended to cover not only the matrix unit of the row and column lines but also the linear array of the photoelectric converting elements.

More specifically, insulative layer 70 is provided to cover substantially the entire surface of substrate 12 to which the sensor unit is mounted. Accordingly, layer 18, electrodes 20, and lines 24 are located below layer 70. Lines 26 and patterns 32a, 32b, 32c, and 32d thereof are formed on layer 70. It should be noted that second metal layer patterns 72 are formed on layer 70 to be electrically connected to patterns 20a of electrodes 20, respectively, through contact holes (not shown). Patterns 72 are electrically connected to corresponding patterns 38 of substrate 14 by wire bonding 74.

According to the image sensor, since layer 70 is formed to cover substantially the entire surface of substrate 12 to which the sensor unit is mounted, the surface of substrate 12 can be flattened, and current leakage and crosstalk upon readout of the pixel signal can be minimized. Accordingly, the operational reliability of the image sensor can be further improved. Moreover, since additional metal layer patterns 72 are provided for common cell electrodes 20, connection conditions such as a layer thickness and conductivity of the connection pad patterns of substrate 12 can be uniformly set. Accordingly, reliability of electrical connection between first and second substrates 12 and 14 can be improved.

Although the invention has been described with reference to a specific embodiment, it shall be understood by those skilled in the art that numerous modifications may be made that are within the spirit and scope of the inventive contribution.

For example, electrical connection between two separate substrates 12 and 14 is not limited to connection pad 50, wire bonding 64, or conductive film 70, but may be modified to use other connection means depending on conditions.

What is claimed is:

1. A solid state image sensor comprising:

first and second substrates positioned adjacent to each other at a contact edge line defined therebetween;

amorphous semiconductor photoelectric converting elements aligned linearly on said first substrate to serve as photoconductive cells of said image sensor, said photoelectric converting elements being divided into cell groups each of which includes photoelectric converting elements which have first terminals serving as individual cell electrodes and second terminals connected to a common cell electrode;

a matrix wiring unit provided on said first substrate to have column signal lines connected to said photoelectric converting elements, and row signal lines crossed with said column lines to form a matrix wiring pattern;

connection pad layers formed on said first substrate such that they are aligned linearly along the contact edge line of said first and second substrates, said connection pad layers including first connection pad layers connected to said common cell electrode of said each cell group and second connection pad layers connected to said row lines; electrical circuit means provided on said second substrate, for selectively driving said cell groups of said photoelectric converting elements to produce a time sequential image signal;

third connection pad layers which are formed on said second substrate to be connected to said electrical circuit means and which are aligned linearly along said contact edge line in such a manner that they are opposed to an array of said first and second connection pad layers; and connector means for electrically connecting said first and second layers to said third pad layers, thereby connecting said photoelectric converting elements with said electrical circuit means through said matrix wiring unit.

2. The image sensor according to claim 1, wherein said second connection pad layers are divided into first pattern groups and second pattern groups which are positioned at both sides of an array of said first connection pad layers.

3. The image sensor according to claim 2, wherein said photoelectric converting elements have a band-like amorphous semiconductor layer formed on said first substrate, and said amorphous semiconductor layer is prevented from overlapping said matrix wiring unit.

4. The image sensor according to claim 3, wherein said row signal lines extend along both sides of said amorphous semiconductor layer and are connected to said first and second pattern groups of said second connection pad layers.

5. The image sensor according to claim 4, further comprising:

an insulative layer formed on said first substrate to be sandwiched between said row signal lines and said column signal lines, said insulative layer having first contact holes, and said row signal lines being connected to corresponding column signal lines through said contact holes.

6. The image sensor according to claim 5, wherein said insulative layer is formed to cover said photoelectric converting elements.

7. The image sensor according to claim 6, wherein said second connection pad layers connected to said row signal lines are formed on said insulative layer, and said first connection pad layers connected to common cell electrodes of said photoelectric converting elements are formed below said insulative layer.

8. The image sensor according to claim 7, wherein said insulative layer has second contact holes, and wherein said first connection pad layers respectively have metal patterns formed on said insulative layer, said metal patterns being electrically conducted to corresponding first connection pad layers through said second contact holes of said insulative layer.

9. The image sensor according to claim 8, further comprising:

support plate means for supporting said first and second substrates.

10. The image sensor according to claim 9, wherein said connector means includes a connection rubber having an elastic insulating rubber and a stripe-shaped conductive pattern formed on one surface of said insulating rubber, and said connection rubber is aligned along said junction edge line between said first and second substrates.

11. The image sensor according to claim 9, wherein said connector means includes a laminated conductive film aligned on said first and second substrates and along said junction edge line between said first and second substrates.

12. The image sensor according to claim 9, wherein said connector means includes a wire bonding arrangement.

* * * * *